(12) United States Patent
Westwood (10) Patent No.: US 9,570,343 B2
(45) Date of Patent: Feb. 14, 2017

(54) RINSING SOLUTION TO PREVENT TIN PATTERN COLLAPSE

(71) Applicant: AVANTOR PERFORMANCE MATERIALS, INC., Center Valley, PA (US)

(72) Inventor: Glenn Westwood, Edison, NJ (US)

(73) Assignee: AVANTOR PERFORMANCE MATERIALS, LLC, Center Valley, PA (US)

( * ) Notice: Subject to any disclaimer, the term of this patent is extended or adjusted under 35 U.S.C. 154(b) by 0 days.

(21) Appl. No.: 14/408,431

(22) PCT Filed: Jun. 21, 2013

(86) PCT No.: PCT/US2013/047082
§ 371 (c)(1),
(2) Date: Dec. 16, 2014

(87) PCT Pub. No.: WO2013/192534
PCT Pub. Date: Dec. 27, 2013

(65) Prior Publication Data
US 2015/0170936 A1    Jun. 18, 2015

Related U.S. Application Data

(60) Provisional application No. 61/663,006, filed on Jun. 22, 2012.

(51) Int. Cl.
*H01L 29/06*     (2006.01)
*H01L 21/461*    (2006.01)
(Continued)

(52) U.S. Cl.
CPC ... *H01L 21/76814* (2013.01); *H01L 21/02068* (2013.01); *H01L 21/02101* (2013.01);
(Continued)

(58) Field of Classification Search
CPC .................... H01L 21/76814; H01L 21/67023
(Continued)

(56) References Cited

U.S. PATENT DOCUMENTS 7,977,039 B2      7/2011   Shimoaoki et al.
9,184,057 B2 *   11/2015   Klipp .................. H01L 21/3083
                                                                430/311
(Continued)

FOREIGN PATENT DOCUMENTS

JP      19946163391 A     6/1994
JP      19957142349 A     6/1995
JP         11511900      10/1999

OTHER PUBLICATIONS

Gyu-Hyun Kim, et al.; Effect of Drying Liquid on Stiction of High Aspect Ration Structures.
(Continued)

*Primary Examiner* — Calvin Lee
(74) *Attorney, Agent, or Firm* — Hoffmann & Baron, LLP (57) ABSTRACT

The present invention is a new formulation and process for treating TiN semiconductor devices having a high aspect ratio structure formed thereon. The new composition is designed to be used in the chip making process between cleaning a wet etched memory device and its final rinse/drying process. It is intended to include the treatment in order to prevent collapse of the high aspect ratio TiN structure found on the semiconductor device.

15 Claims, 8 Drawing Sheets

(51) Int. Cl.
*H01L 21/768* (2006.01)
*H01L 21/02* (2006.01)
*H01L 21/67* (2006.01)

(52) U.S. Cl.
CPC .. *H01L 21/67023* (2013.01); *H01L 21/67028* (2013.01); *H01L 2924/0002* (2013.01)

(58) Field of Classification Search
USPC .................. 438/745–754, 704; 257/623, 617
See application file for complete search history.

(56) References Cited

U.S. PATENT DOCUMENTS

| | | |
|---|---|---|
| 2007/0060490 A1 | 3/2007 | Skee |
| 2008/0125342 A1* | 5/2008 | Visintin ............... C11D 3/0073 510/175 |
| 2011/0054184 A1 | 3/2011 | Yoshida et al. |
| 2011/0073011 A1 | 3/2011 | Yoshida et al. |
| 2011/0118494 A1 | 5/2011 | Yoshida et al. |
| 2011/0195190 A1 | 8/2011 | Koshiyama et al. |
| 2012/0135604 A1 | 5/2012 | Ohto et al. |
| 2013/0280123 A1* | 10/2013 | Chen ..................... H01L 21/302 422/1 |

OTHER PUBLICATIONS

C.C. Yang, et al.; Wet Clean Induce Pattern Collapse Mechanism Study.

* cited by examiner

RINSING SOLUTION TO PREVENT TiN PATTERN COLLAPSE

CROSS-REFERENCE TO RELATED APPLICATIONS

This application claims the benefit under 35 U.S.C. 119(e) of U.S. Provisional Application No. 61/663,006 filed on Jun. 22, 2012, and also claims benefit of International Application No. PCT/US2013/047082 filed on Jun. 21, 2013, the disclosure of which is incorporated herein in its entirety.

BACKGROUND OF THE INVENTION

The present invention relates to the art of preparing high performance semiconductor memory devices, and, in particular, those which may experience pattern collapse as a result of having high aspect ratio TiN structures formed thereon.

Since the invention of the integrated circuit in or about 1958, etching has been an important technology to the semiconductor industry. More recently, with advent of memory devices scaled down to below 50 nanometers, high aspect ratio (HAR) structures present a challenge to the manufacture process of semiconductor memory devices. In particular, a phenomenon known as pattern collapse occurs when forming several inorganic patterns on a substrate in parallel. Pattern collapse occurs when adjacent patterns deform so as to lean on one another, or, indeed, break down or become damaged when drying in the presence of a rinse liquid used after pattern formation. The force causing pattern collapse results from capillary forces which occur during the drying phase after rinsing by the rinse liquid. Thus, when the rinse liquid is removed in the drying step, stress resulting from capillary forces acting on the patterns causes collapse.

Various techniques and chemistries have been tried to prevent pattern collapse sufficiently to enable the manufacturers to fabricate the high aspect ratio structures by, e.g., conventional wet etching processes, and then rinsing and drying to prepare the devices for use. One body of technology relates to treating high aspect ratio containing substrate surfaces with a silylating agent.

For example, United States Published Patent Application US 2011/0195190 A1 ("190 Publication") discloses a surface treatment using a treatment liquid containing a silylating agent and a hydrocarbon non-polar solvent. The technique disclosed in the '190 Publication claims to be an improvement over a vapor treatment with a silylating agent as disclosed in Japanese Unexamined Patent Application, Publication No. S60-25231 and Japanese Unexamined Patent Application, Publication No. 2007-19465. It claims to be a further improvement of the technology disclosed in Japanese Unexamined Patent Application, Publication No. H6-163391 and Japanese Unexamined Patent Application, Publication No. H7-142349. See also non-patent reference "Proceedings of FPIE", Volume 5754, pp. 119-128 (2005).

Further in this regard U.S. Patent Published Application US 2011/0073011 A1 ("'011 Publication") discloses a surface treatment agent which includes a silyation agent containing at least one compound having a disilazane structure and a solvent containing a five- or six-membered ring lactone compound. The '011 Publication also refers to Japanese Unexamined Application, Publication No. H11-511900 for its disclosure of a silyation treatment using hexamethyldisilazane (HMDS). Problems concerning effective treatment using HMDS are claimed to have been overcome by using a silyation agent having a disilazane structure and a solvent containing a five- or six-membered ring lactone compound.

U.S. Published Application US 2011/0118494 A1 ("'494 Publication") claims to overcome problems associating with treatment of TiN or SiN using a cyclic silazane compound. The treatment disclosed in the '494 Publication includes an organic solvent capable of dissolving the cyclic silazane compound but which does not react with the compound and causes little or no damage to the substrate surface which is treated.

Further with respect to this technology, published U.S. Application No. US 2011/0054184 A1 ("'184 Publication") discloses conducting a silyation treatment on the surface of a semiconductor substrate using an agent which includes a silyation agent and a silylated heterocyclic compound. The silylated heterocyclic group included in such compound is preferably a silylated nitrogen-containing heterocyclic compound which is characterized as having aromaticity. Solvents which can be used in the treatment disclosed in the '184 Publication are those solvents which are also set forth in the '494 Publication.

U.S. Pat. No. 7,977,039 B2 ("'039 Patent") discloses a rinse treatment for cleaning a substrate after an exposed pattern thereon has been subjected to developing treatment. The method of the '039 Patent include supplying pure water onto the substrate to clean the substrate, followed by supplying a first rinse solution composed of a surfactant with a predetermined concentration and thereafter supplying a second rinse treatment composed of a surfactant with a concentration lower than that of the first rinse solution.

Thus, while there have been several attempts at providing methods and compositions for preventing pattern collapse, the present invention provides an intermediate process step and composition for use between the cleaning and the final rinse/dry step to prevent pattern collapse of high aspect ratio TiN structures semiconductor devices.

SUMMARY OF THE INVENTION

The present invention includes a process and composition for treating the surface of a high aspect ratio TiN structure in a semiconductor memory device to prevent pattern collapse during a final rinsing/drying step. The composition used in the process includes a solvent having predominantly polar characteristics and an anionic fluorosurfactant in an amount adequate to anchor to the surface of a TiN structure so that the contact angle of a rinse subsequently imposed thereon during drying is sufficient to prevent collapse of the structure.

In an embodiment, the solvent is $C_1$-$C_6$ alcohol or water. In another embodiment, the solvent is isopropanol or water. In an embodiment, the solvent is isopropanol. In another embodiment, the solvent is water.

In an embodiment, the anionic fluorosurfactant includes a reaction product of a phosphorous-containing acid, and a fluorinated alcohol. In another embodiment, the anionic fluorosurfactant further comprises one or more from the group of ammonium salts and ester-containing compounds. In an embodiment, the anionic fluorosurfactant further contains ammonium salts. In another embodiment, the anionic fluorosurfactant further contains ester-containing compounds, and in another embodiment the anionic fluorosurfactant further contains both ammonium salts and ester-containing compounds.

In an embodiment, the phosphorous-containing acid is selected from the group of phosphonic acid, phosphoric acid, phosphorous pentoxide, hypophosphorous acid, tautomers, isomers, salts, esters, mixtures, and solutions thereof, and the fluorinated alcohol is a partially fluorinated alcohol selected from the group of perfluorooctylundecanol, trifluoroethanol, 4,4,5,5,5,-pentafluoro-1-penatanol, 4,4,4-trifluoro-1-butanol, alcohols of the formula $HOC_xH_yF_z$ (where x=1-20, and y+z=2x+1), and alcohols of the formula $F(CF_2CF_2)_xCH_2CH_2OH$, where x is 1 to 10.

In an embodiment, the TiN structures have an aspect ratio of about less than 20:1, and in another embodiment, the aspect ratios of the TiN structures are about 6:1 to about 12:1. In another embodiment, the contact angle θ of an isopropanol rinse on the TiN surface (post treatment with the inventive composition) is at least about 15°, and in a preferred embodiment, the contact angle θ of the isopropanol rinse on the TiN surface is at least about 25°, and in yet another preferred embodiment the contact angle θ of the isopropanol rinse has a contact angle of at least about 40°.

In another embodiment, the contact angle θ of a water rinse on the TiN surface (post treatment with the inventive composition) is at least about 75°, and in a preferred embodiment, the contact angle θ of the water rinse on the TiN surface is at least about 100°, and in yet another preferred embodiment the contact angle θ of the water rinse has a contact angle of at least about 115°.

In an embodiment, the anionic fluorosurfactant constitutes from about 0.03% to about 80% by weight of the composition, and preferably from about 0.05% to about 10% by weight of the composition.

Examples of anionic fluorosurfactants include DuPont fluorosurfactants Capstone FS-63®, Capstone FS-64®, Capstone FS-65®, and Capstone FS-66®. Another phosphonic acid fluorosurfactant useful in the present invention is perfluorooctylphosphonic acid.

In yet another embodiment, a process for treating the surface of a high aspect ratio TiN structure in a semiconductor memory device to prevent pattern collapse during a final rinsing/drying step is provided herein. The process includes contacting the surface of a high aspect ratio TiN semiconductor pattern before final rinse and drying with a treatment composition as disclosed herein. The use of a composition for treating the surface of a high aspect ratio TiN structure in a semiconductor memory device to prevent pattern collapse during a final rinsing/drying step is also provided herein.

In an embodiment, the process takes place at a temperature of about 20° C. to about 60° C., and for a time of about 45 seconds to about 360 seconds, and preferably at a temperature of about 25° C. to about 55° C., and for a time of about 90 seconds to about 600 seconds.

In use, after the composite semiconductor has undergone a wet etch process and initial cleaning, the composition described above can be used as a rinse solution before final rinsing with an aqueous medium or solvent rinse and drying. As a consequence of the composition and intermediate rinse step, the anionic fluorosurfactant molecules can be anchored directly to titanium atoms located on the surface of the high aspect ratio structure. When a sufficient amount of binding has occurred, a self-assembled monolayer is formed on the surface of the high aspect ratio structure.

As a result of this inventive composition and process, the surface of the TiN exhibits sufficient hydrophobicity such that the contact angle of a subsequent rinse solution, whether it be isopropyl alcohol or water, is increased sufficiently to reduce the capillary forces experienced during rinsing and drying so that no damage occurs.

For a better understanding of the present invention, together with other and further objects and advantages, reference is made to the following detailed description, taken in conjunction with the accompanying examples, and the scope of the invention will be pointed out in the appended claims. The following detailed description is not intended to restrict the scope of the invention by the advantages set forth above.

DETAILED DESCRIPTION OF THE INVENTION

The present invention is a new formulation and process for treating TiN semiconductor devices having a high aspect ratio structure formed thereon. The new composition is designed to be used in the chip making process between cleaning a wet etched memory device and its final rinse/drying process. It is intended to include the treatment in order to prevent collapse of the high aspect ratio TiN structure found on the semiconductor device.

It is known in the art of high aspect ratio memory devices which are scaled down to below not more than about 50 nanometers, e.g., such as in shallow trench isolation (STI) patterns, gate line patterns and cylindrical capacitor patterns, are subject to pattern collapse. The drying process can induce pattern collapse because of adhesion forces induced by capillary forces of drying liquid on the patterns.

Many methods have been used to try to solve the collapse problem of high-aspect ratio structures including collapse behavior dependant on the line and space pattern of the structure. The deformation δ of the structures during drying has the following mathematical relationship:

$$\delta = 3\gamma \cos \theta H^4/dEL^3$$

The deformation δ is related to the surface tension of the rinsing fluid, γ, the contact angle, θ, of the rinsing fluid with the surface, β, and the height H of the structure and the distance between the patterns, d. The expression E is Young's modulus of the pattern while L is the length of the feature.

Examination of this relationship make it clear that reduction of force contributing to collapse of a TiN feature during drying can be effected by lowering the surface tension, γ, of the rinsing fluid and/or increasing the contact angle, θ, of the rinsing solution with the TiN surface, since magnitude of the cosign of angles is inversely related to the size of the angle. Consequently, if measures can be taken which reduce a surface tension γ, or increase the contact angle θ, deformation, δ, can be controlled to minimize and/or eliminate the phenomenon of structure collapse.

As defined above, the contact angle θ is the angle formed between the rinsing solution and the TiN surface, and can be determined by measuring an angle created by a first ray and a second ray, the first ray projecting along the TiN surface, and the second ray projecting tangentially along the inner circumference of a liquid drop on the TiN surface. The greater the contact angle θ, the more upright the liquid drop is along the TiN surface, thus allowing for less deformation of the surface pattern.

The smaller the contact angle θ is, the less effective the composition is at preventing pattern collapse. At a contact angle θ of 0° to 5°, for example, the liquid drop spreads out on the surface, and the circular structure of the liquid drop is less discernible. A contact angle θ of zero, for example, represents no discernible circular structure. A higher contact angle θ however, such as in the range of 6° to 175°, represents a more "balled up" liquid drop on the surface, and is more effective at preventing pattern collapse. The closer this contact angle is to 90°, the less likely damage will be expected.

An "anionic fluorosurfactant" as used herein refers to a phosphorous-containing acid and a fluorinated alcohol. The phosphorous-containing acid comprises phosphorous, oxygen, and hydrogen in various ratios, and includes without limitation, phosphonic acid ($H_3PO_3$), phosphoric acid ($H_3PO_4$), hypophosphorous acid ($H_3PO_2$), tautomers, isomers, esters, salts, mixtures, and solutions thereof. In a preferred embodiment, the phosphorous-containing acid is phosphonic acid. It is recognized that when the phosphorous-containing acid is linked with a fluorinated alcohol to form an anionic fluorosurfactant, that the corresponding formula for the phosphorous-containing acid, such as phosphonic acid for example, is $RPO_3H_2$, where R represents the fluorinated alcohol.

The fluorinated alcohol comprises a hydrocarbon compound with —OH functionality, also including fluorine. The fluorinated alcohol may be partially or fully fluorinated. Some examples of fluorinated alcohols include but are not limited to perfluorooctylundecanol, trifluoroethanol, 4,4,5,5,5,-pentafluoro-1-penatanol, 4,4,4-trifluoro-1-butanol, alcohols of the formula $HOC_xH_yF_z$ (where x=1-20, and y+z=2x+1), and alcohols of the formula $F(CF_2CF_2)_x CH_2CH_2OH$, where x is 1 to 10.

The fluorinated alcohols are included in the commercially available fluorosurfactants, such as Capstone FS-63®, Capstone FS-64®, Capstone FS-65®, and Capstone FS-66®.

The anionic fluorosurfactant optionally further comprises other ingredients with varying functionality. For example, ammonium salts and various ester-containing compounds may be included in the phosphonic acid fluorosurfactant. Some ammonium salts include but are not limited to ammonium, tetramethylammonium, tetrabutylammonium, tetrapropylammonium, tetraethylammonium, and benzyltrimethylammonium. Some ester-containing compounds include but are not limited to chains of polyhexafluorpropyleneoxide (F—(CF(CF$_3$)—CF$_2$—O)$_n$—) [where n=1 to 60].

A "$C_1$-$C_6$ alcohol" as used herein refers to a fully saturated branched or unbranched hydrocarbon moiety having up to 6 carbon atoms and containing at least one —OH group. The $C_1$-$C_6$ alcohols contemplated in the present invention are mostly polar solvents. Some examples include but are not limited to n-Butanol, isopropanol, n-propanol, ethanol, and methanol.

A "high aspect ratio" structure as used herein refers to a formerly planar surface which has been etched to define trenches and peaks thereupon, wherein the depth of the trench is greater than its width. The depth is defined as the distance from the base of the trench to the average height of the peaks surrounding it. The width is defined as the shortest distance between peaks as measured along the base of the trench.

Etched microelectronic structures, such as semiconductors, typically have an etched surface with depths in the range of from about 20 nm to about 2 μm, and widths in the range of from about 10 nm to about 200 nm, giving depth to width ratios, or aspect ratios of about 1:10 to about 100:1. Because of the stress of the rinsing formulas, as well as other factors mentioned above, the depth and depth to width ratios are limited. It is therefore a clear advantage of the present invention to provide processing conditions and a treatment composition which allows increased depth and depth to width ratios of TiN structures.

EXAMPLES

The present invention is further exemplified, but not limited, by the following representative examples, which are intended to illustrate the invention and are not to be construed as being limitations thereto.

Example 1

Three treatment compositions (Samples A, B, and C) of the present invention were prepared and used to coat a TiN coated substrate. A drop of water and isopropanol were then dropped on the coated substrates and the contact angle θ was measured.

Sample A was prepared by mixing 2.09 g of Capstone 64 in 38.00 g of water. Two TiN coated wafers were then treated in a solution for 30 minutes at 200 rpm at 55° C., followed by a 1 min. water rinse, to give two wafers coated with Sample A.

Sample B was prepared by mixing 2.02 g of Capstone 63 in 30.63 g of water. Two TiN coated wafers were then treated in a solution for 30 minutes at 200 rpm at 55° C., followed by a 1 min. water rinse, to give two wafers coated with Sample B.

Sample C was prepared by mixing 2.00 g of Capstone 66 in 46.00 g of isopropanol. Two TiN coated wafers were then treated in a solution for 30 minutes at 200 rpm at 55° C., followed by a 1 min. water rinse, to give two wafers coated with Sample C.

Figure 1:
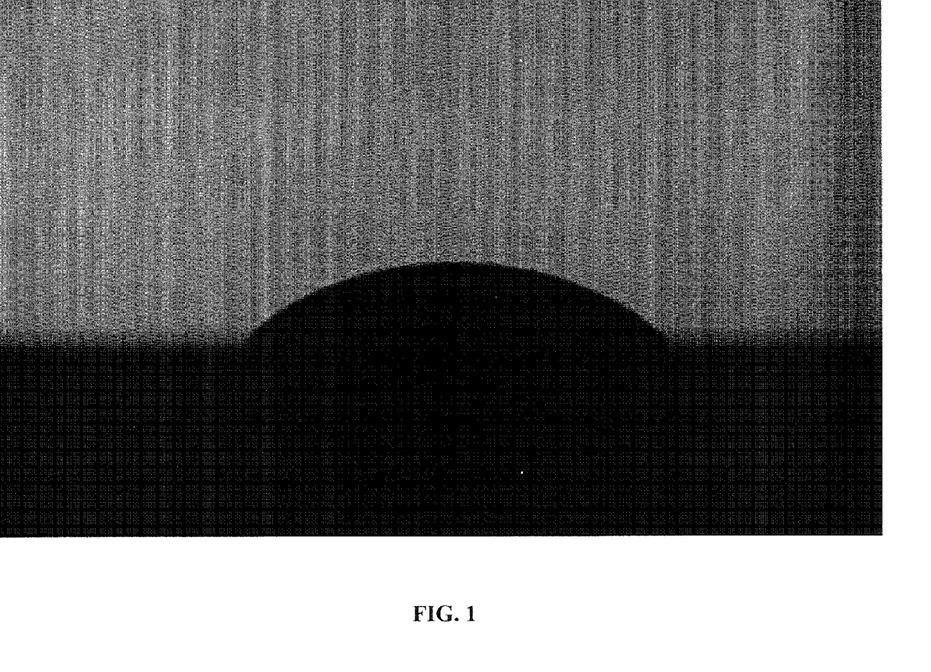
FIGS. 1 and 2 are photomicrograph cross-sections of a TiN coated substrate (untreated) with a drop of water and a drop of isopropanol on the surface.
Figure 2:
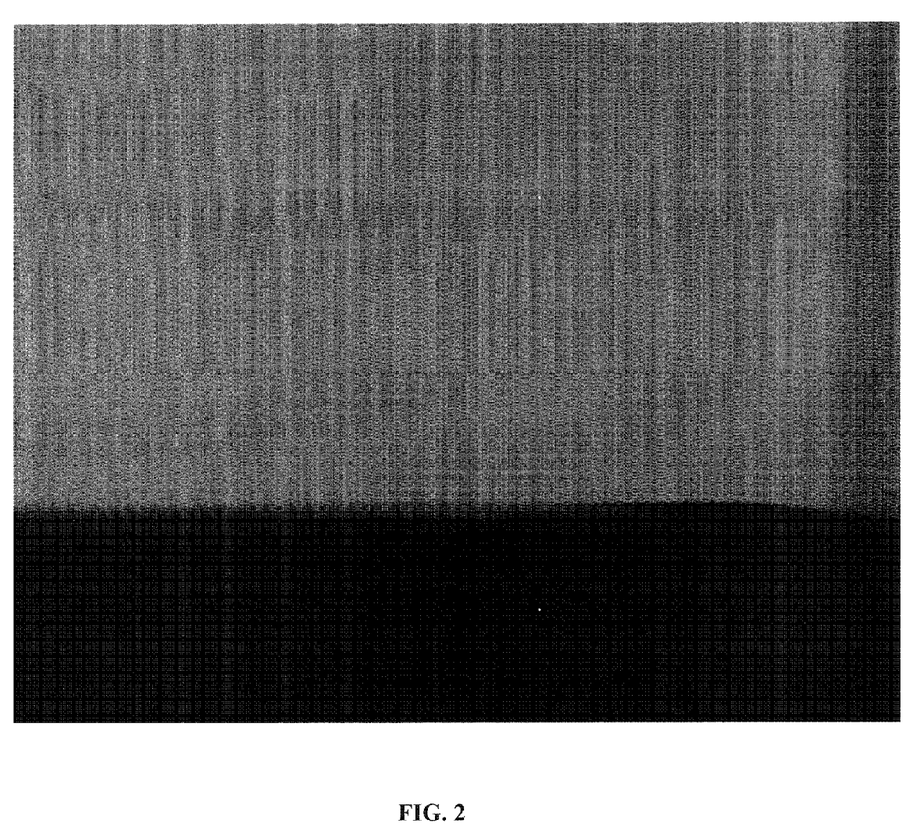

With reference to the drawings, FIGS. 1 and 2 show photomicrograph cross-sections of a TiN coated substrate with a drop of water (FIG. 1) and a drop of isopropanol (FIG. 2) on the surface. The substrate of FIGS. 1 and 2 were not treated with the inventive compositions. A water drop and an isopropanol (IPA) drop were placed on the substrate of FIG. 1 and contact angle theta was measured. The water drop had a contact angle θ of 66.7°, and the IPA drop of FIG. 2 had a contact angle θ of 0°.

Figure 3:
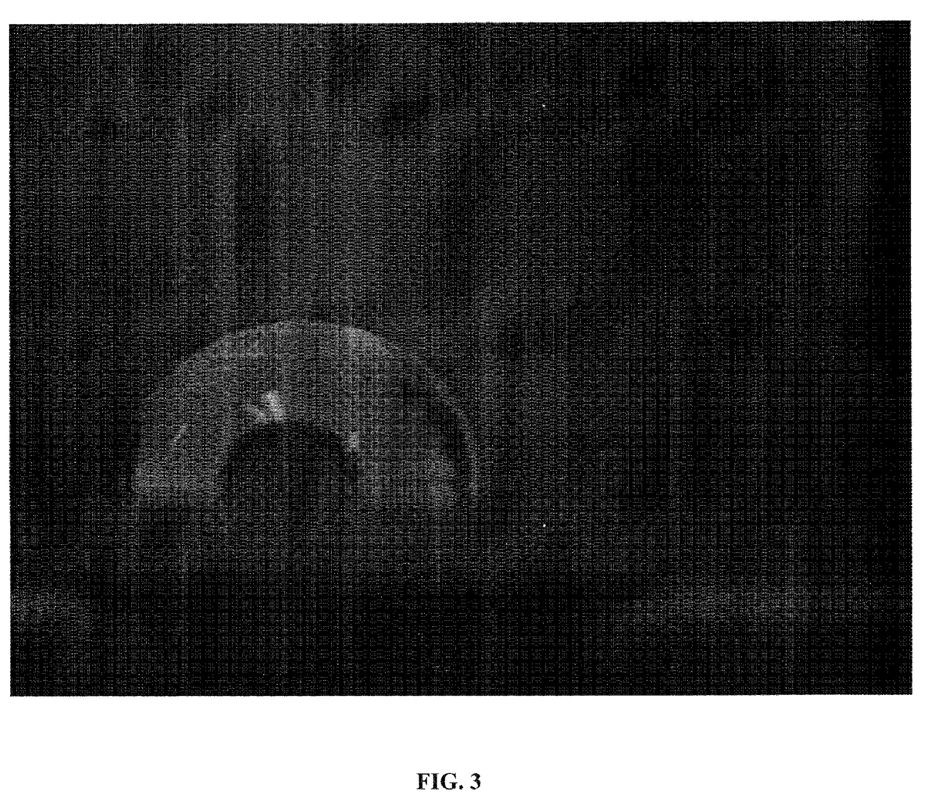
FIGS. 3 and 4 are photomicrograph cross-sections of a TiN coated substrate treated with a composition of the present invention, and with a drop of water and a drop of isopropanol on the surface.
Figure 4:
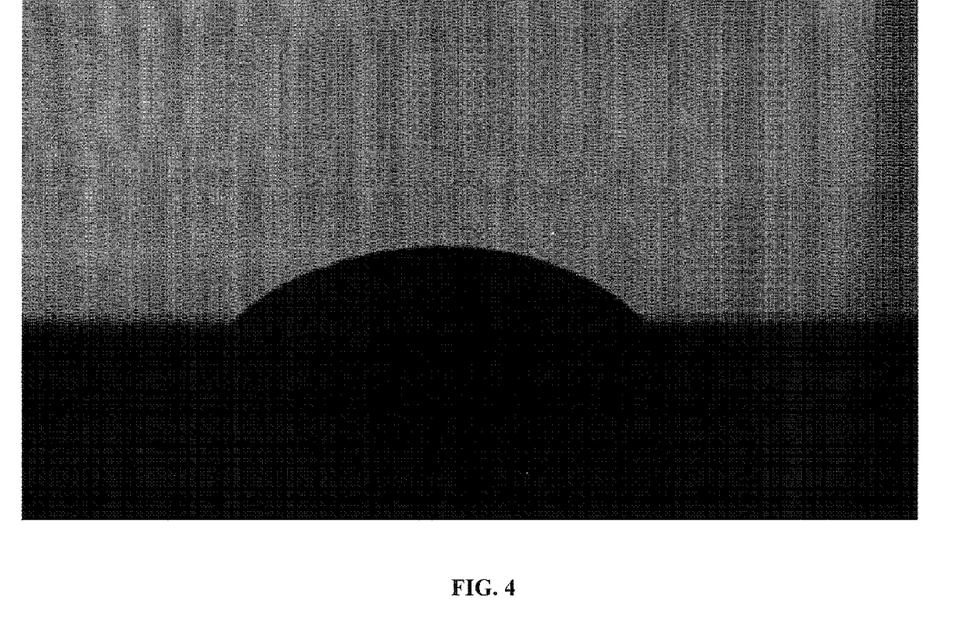

In FIGS. 3 and 4, photomicrograph cross-sections of a TiN coated substrate with a drop of water and a drop of isopropanol are shown on the surface of the substrate, which was treated with sample C of the examples. A water drop (FIG. 3) and a drop of isopropanol (FIG. 4) were both placed on the substrate, and the contact angle theta was measured. The water drop of FIG. 3 had a contact angle θ of 101.4°, and the IPA drop had a contact angle of 44.1°, as seen in FIG. 4.

Figure 5:
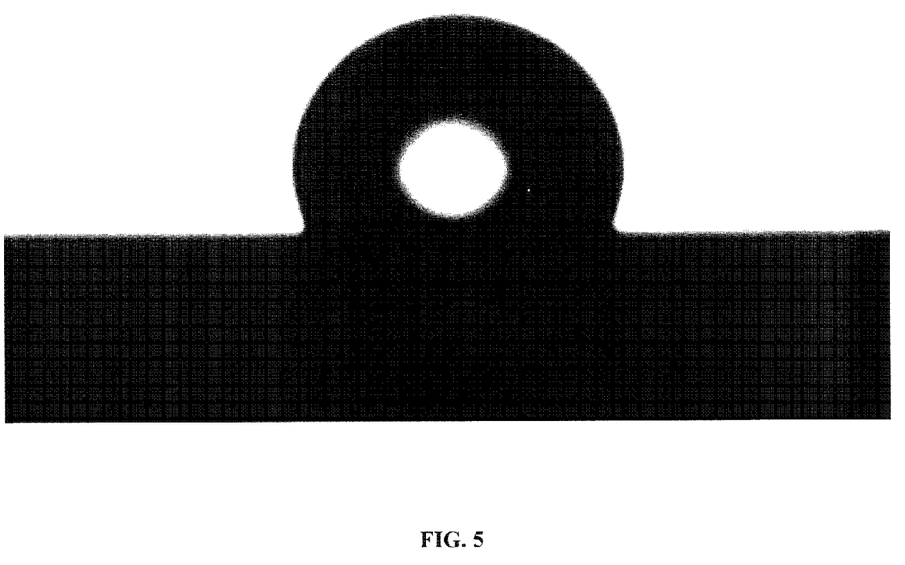
FIGS. 5 and 6 are photomicrograph cross-sections of a TiN coated substrate treated with a composition of the present invention, and with a drop of water and a drop of isopropanol on the surface.
Figure 6:
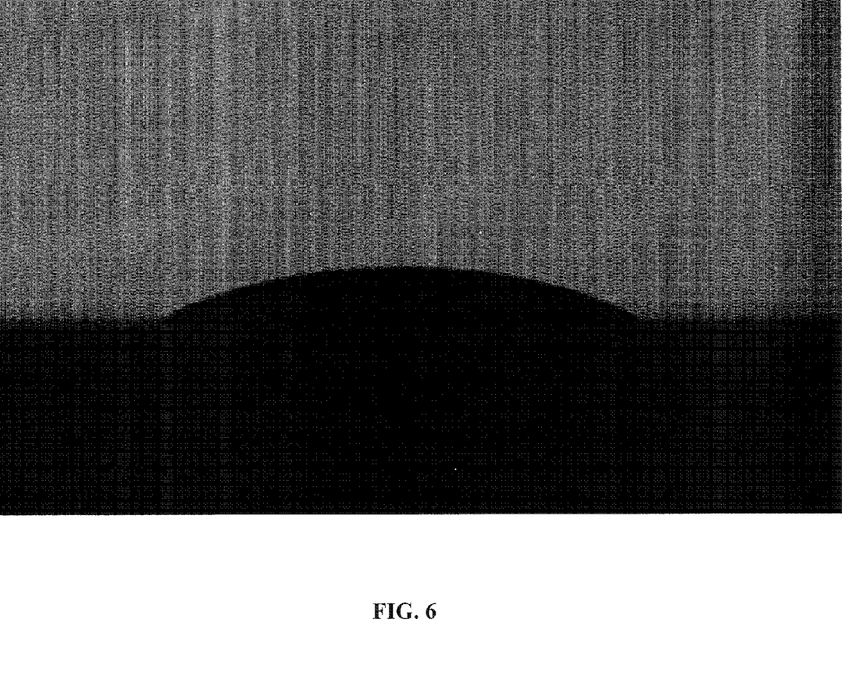

With further reference to the drawings, FIGS. 5 and 6 show photomicrograph cross-sections of a TiN coated substrate with a drop of water (FIG. 5) and a drop of isopropanol (FIG. 6) on the surface. The substrate of FIGS. 5 and 6 were treated with the inventive composition, sample A of the examples. A water drop and an isopropanol drop were placed on the substrate shown in FIGS. 5 and 6, and contact angle theta was measured. The water drop had a contact angle θ of 102.8° as seen in FIG. 5. The IPA drop had a contact angle θ of 27.1° as seen in FIG. 6.

Figure 7:
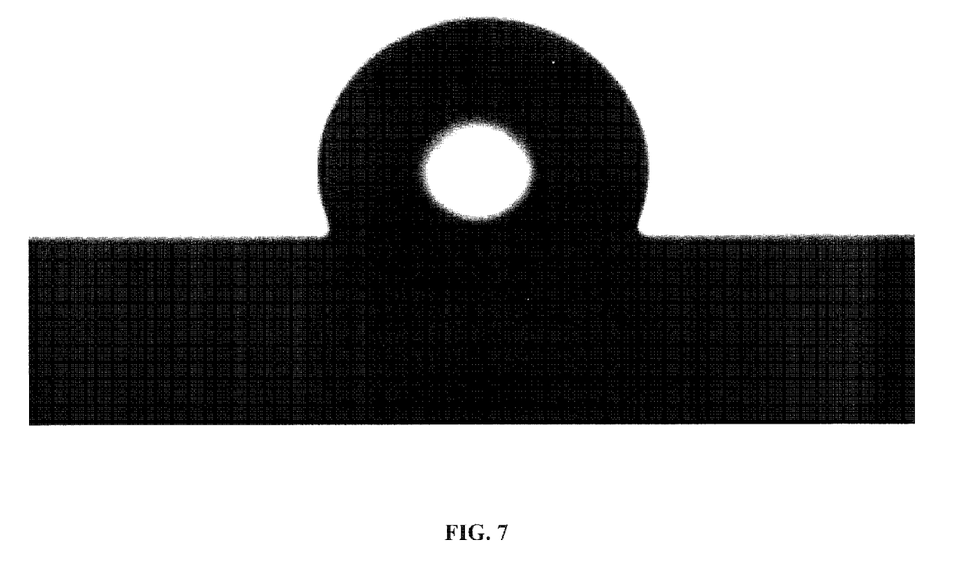
FIGS. 7 and 8 are photomicrograph cross-sections of a TiN coated substrate treated with a composition of the present invention, and with a drop of water and a drop of isopropanol on the surface.
Figure 8:
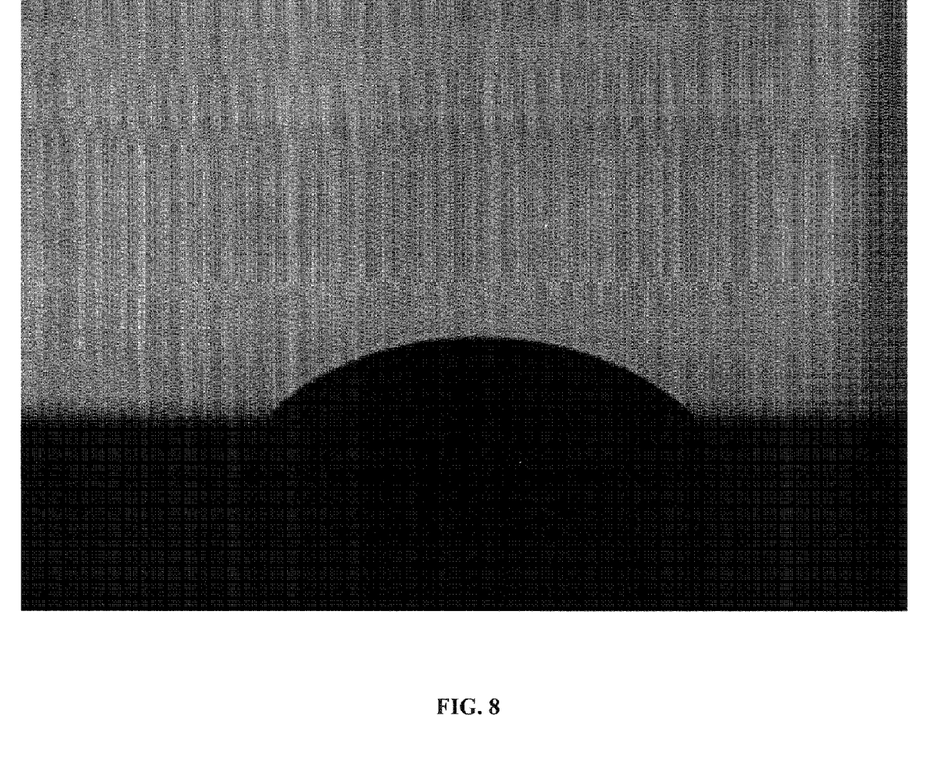

FIGS. 7 and 8 show photomicrograph cross-sections of a TiN coated substrate with a drop of water (FIG. 7), and a drop of isopropanol (FIG. 8) on the surface. The substrate of FIGS. 7 and 8 were treated with the inventive composition, sample B of the examples. A water drop (FIG. 7) and an isopropanol drop (FIG. 8) were placed on the substrate shown in FIGS. 7 and 8, and contact angle theta was measured. The water drop had a contact angle θ of 118.7° as can be seen in FIG. 7. The IPA drop had a contact angle θ of 43.6° as seen in FIG. 8.

The compositions and methods of the present invention, as exemplified in samples A, B, and C, and shown in FIGS. 1-8 provide a surface treatment for TiN surface which significantly increases the contact angle of a liquid subsequently in contact with the surface. The liquid is typically a rinse liquid in the back-end of the manufacturing process of a semiconductor, and a higher contact angle of the rinse less improves the rinsing process, allowing for TiN structures with high aspect ratios. The surface treatment and methods associated therewith therefore provide an improved process for making wafers with high aspect ratio surfaces.

Thus while there have been described what are presently believed to be preferred embodiments of the invention, those skilled in the art will realize that changes and modifications may be made thereto without departing from the spirit of the invention, and it is intended to claim all such changes and modifications as fall within the true scope of the invention.

What is claimed is:

1. A semiconductor pattern surface treatment composition for preventing collapse of high-aspect ratio TiN structures in a semiconductor memory device during fabrication comprising:
   a) a solvent having predominantly polar characteristics, said solvent selected from the group of $C_1$-$C_6$ alcohol or water; and
   b) an anionic fluorosurfactant in an amount adequate to anchor to the surface of a TiN structure so that the contact angle of a rinse subsequently imposed thereon is sufficient to prevent collapse of said structure, wherein said anionic fluorosurfactant comprises a phosphorous-containing acid and a fluorinated alcohol.

2. The semiconductor pattern surface treatment composition according to claim 1 wherein said solvent is isopropanol or water.

3. The semiconductor pattern surface treatment composition according to claim 1 wherein said anionic fluorosurfactant further comprises at least one from the group of ammonium salts and ester-containing compounds.

4. The semiconductor pattern surface treatment composition according to claim 1 wherein said phosphorous-containing acid is selected from the group of phosphonic acid, phosphoric acid, hypophosphorous acid, tautomers, isomers, esters, salts, mixtures, and solutions thereof.

5. The semiconductor pattern surface treatment composition according to claim 1 wherein said fluorinated alcohol is a partially fluorinated alcohol selected from the group of perfluorooctylundecanol, trifluoroethanol, 4,4,5,5,5,-pentafluoro-1-penatanol, 4,4,4-trifluoro-1-butanol, alcohols of the formula $HOC_xH_yF_z$ (where x=1-20, and y+z=2x+1), and alcohols of the formula $F(CF_2CF_2)_xCH_2CH_2OH$, where x is 1 to 10.

6. The semiconductor pattern surface treatment composition according to claim 1 wherein said TiN structures have an aspect ratio of about less than 20:1.

7. The semiconductor pattern surface treatment composition according to claim 1 wherein said TiN structures have an aspect ratio of about 6:1 to about 20:1.

8. The semiconductor pattern surface treatment composition according to claim 1 wherein said contact angle of said isopropanol rinse on said TiN surface is at least about 15°.

9. The semiconductor pattern surface treatment composition according to claim 1 wherein said contact angle of said isopropanol rinse on said TiN surface is at least about 25°.

10. The semiconductor pattern surface treatment composition according to claim 1 wherein said contact angle of said isopropanol rinse on said TiN surface is at least about 40°.

11. The semiconductor pattern surface treatment composition according to claim 1 wherein said contact angle of said water rinse on said TiN surface is at least about 75°.

12. The semiconductor pattern surface treatment composition according to claim 1 wherein said contact angle of said water rinse on said TiN surface is at least about 100°.

13. The semiconductor pattern surface treatment composition according to claim 1 wherein said contact angle of said water rinse on said TiN surface is at least about 115°.

14. The semiconductor pattern surface treatment composition according to claim 1 wherein said anionic fluorosurfactant comprises from about 0.03% to about 15% by weight of the composition.

15. The semiconductor pattern surface treatment composition according to claim 1 wherein said anionic fluorosurfactant comprises from about 0.05% to about 10% by weight of the composition.

* * * * *